US006423938B1

(12) United States Patent
Murari et al.

(10) Patent No.: US 6,423,938 B1
(45) Date of Patent: Jul. 23, 2002

(54) METHOD FOR THE ELECTRICAL AND/OR MECHANICAL INTERCONNECTION OF COMPONENTS OF A MICROELECTRONIC SYSTEM

(75) Inventors: Bruno Murari; Ubaldo Mastromatteo, both of Milan; Benedetto Vigna, Potenza, all of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/662,984

(22) Filed: Sep. 15, 2000

(30) Foreign Application Priority Data

Sep. 17, 1999 (EP) .............................. 99830586

(51) Int. Cl.[7] .............................. H05B 1/00; H05B 3/00; H05B 11/00
(52) U.S. Cl. ........................................ 219/209; 174/262
(58) Field of Search .................. 438/49, 119; 219/209, 219/497, 85.1, 86.1; 228/179, 180, 181, 182.22; 73/204.19; 204/153.18; 428/408; 338/306, 308; 347/114; 385/90; 360/294.4; 702/136

(56) References Cited

U.S. PATENT DOCUMENTS

| 4,472,239 A | * | 9/1984 | Johnson et al. ............... 438/49 |
| 4,524,264 A | * | 6/1985 | Takeichi et al. ............. 219/497 |
| 4,696,188 A | * | 9/1987 | Higashi .................... 73/204.19 |
| 5,053,742 A | * | 10/1991 | Masuda ....................... 338/162 |
| 5,268,558 A | * | 12/1993 | Youssef et al. .............. 219/209 |
| 5,389,218 A | * | 2/1995 | Bonne et al. .......... 204/153.18 |
| 5,477,933 A | * | 12/1995 | Nguyen ....................... 174/262 |
| 5,645,937 A | * | 7/1997 | Noda et al. .................. 428/408 |
| 5,696,491 A | * | 12/1997 | White et al. ................. 340/657 |
| 5,920,978 A | | 7/1999 | Koshikawa et al. ..... 29/603.12 |
| 6,108,016 A | * | 8/2000 | Takizawa .................... 347/114 |
| 6,118,637 A | * | 9/2000 | Wright et al. ............ 360/294.4 |
| 6,164,837 A | * | 12/2000 | Haake et al. .................. 385/90 |
| 6,169,965 B1 | * | 1/2001 | Kubisiak et al. ............ 702/136 |
| 6,181,531 B1 | * | 1/2001 | Koshikawa et al. ..... 360/294.4 |
| 6,232,150 B1 | * | 5/2001 | Lin et al. ..................... 438/119 |
| 6,303,288 B1 | * | 10/2001 | Furcht et al. ................... 435/4 |

FOREIGN PATENT DOCUMENTS

| EP | 0913921 | 6/1999 | |
| JP | 2000195999 | * 7/2000 | ......... H01L/23/427 |

OTHER PUBLICATIONS

Vol. 011, No. 237 (E–528), Aug. 4, 1987 & JP 62 049639 A (Sharp Corp), Mar. 4, 1987.
Vol. 017, No. 238 (E–1363), May 13, 1993 & JP 04 364742 A (Seiko Epson Corp.), Dec. 17, 1992.
Vol. 018, No. 617 (E–1634), Nov. 24, 1994 & JP 06 236886 A (NEC Corp.), Aug. 23, 1994.

* cited by examiner

*Primary Examiner*—Joseph Pelham
*Assistant Examiner*—L Fastovsky
(74) *Attorney, Agent, or Firm*—Lisa K. Jorgenson; Allen, Dyer, Doppelt, Milbrath & Gilchrist, P.A.

(57) ABSTRACT

A method for the electrical and/or mechanical interconnection of components of a microelectronic system includes at least one first component and at least one second component to be connected, and at least one local Joule-effect microheater is incorporated in one of the first and second components at a respective soldering point therebetween. The method includes supplying electrical energy to the microheater to utilize the heat produced therefrom by the Joule effect to solder the first and second components at the respective soldering point.

26 Claims, 5 Drawing Sheets

METHOD FOR THE ELECTRICAL AND/OR MECHANICAL INTERCONNECTION OF COMPONENTS OF A MICROELECTRONIC SYSTEM

FIELD OF THE INVENTION

The present invention relates to the field of microelectronics, and, more particularly, to a multi-component microelectronic system, such as a micro-electromechanical system (MEMS) or a multichip system in which two or more component parts of the system are electrically and/or mechanically interconnected.

BACKGROUND OF THE INVENTION

In the production of complex micro-electromechanical systems (MEMS) that include several mechanically and/or electrically interconnected subsystems, the greatest difficulties are encountered during the interfacing and connection of the various subsystems. For example, in hard-disk reading/writing units having micrometric actuation for the fine positioning of the reading/writing transducers (heads or sliders), it is necessary to interconnect the suspension, the micro-actuator, and the slider.

The slider is fixed to the rotor of the micro-actuator, and is usually glued to a support plate which in turn is anchored to the rotor. The slider is also soldered at several points to flexible mechanical connection elements or springs suspended above the rotor and connected in a cantilevered manner to the static part of the micro-actuator. The electrical terminals of the slider are soldered to further flexible electrical connection elements or springs also suspended above the rotor, and connected in a cantilevered manner to the static portion of the micro-actuator. There are at least four electrical terminals, two for reading and two for writing.

The soldering operations are generally performed by a ball bonding technique and are extremely delicate operations. Moreover, if the micro-actuator is found to be faulty during the subsequent functional testing stage, the entire micro-electromechanical system has to be rejected since the functioning components of the system cannot easily be disconnected for reuse.

Similar problems arise in multichip systems in which two or more chips, each incorporating a respective integrated circuit, have to be mechanically and electrically interconnected in predetermined regions to form a single microelectronic system. In this case also, in addition to the difficulty of the soldering operation, production output is greatly penalized by the fact that it is very difficult to disconnect faulty chips from functioning ones to be able to reuse the latter.

SUMMARY OF THE INVENTION

In view of the foregoing background, it is an object of the present invention to provide a method for the electrical and/or mechanical connection of component parts of a microelectronic system which overcomes the problems mentioned above.

According to the present invention, this object is achieved by a method for the electrical and/or mechanical interconnection of components of a microelectronic system, characterized in that it provides for the formation of at least one local Joule-effect micro-heater. The micro-heater is incorporated at a respective soldering point between a first component and a second component of the micro-electromechanical system. The method further includes providing electrical energy to the micro-heater to utilize the heat produced by the micro-heater by the Joule effect for the soldering of the first and second components at the soldering point.

BRIEF DESCRIPTION OF THE DRAWINGS

The characteristics and advantages of the present invention will become clear from the following detailed description of two practical embodiments, illustrated by way of non-limiting examples in the appended drawings, in which.

DETAILED DESCRIPTION OF THE PREFERRED EMBODIMENTS

Figure 1:
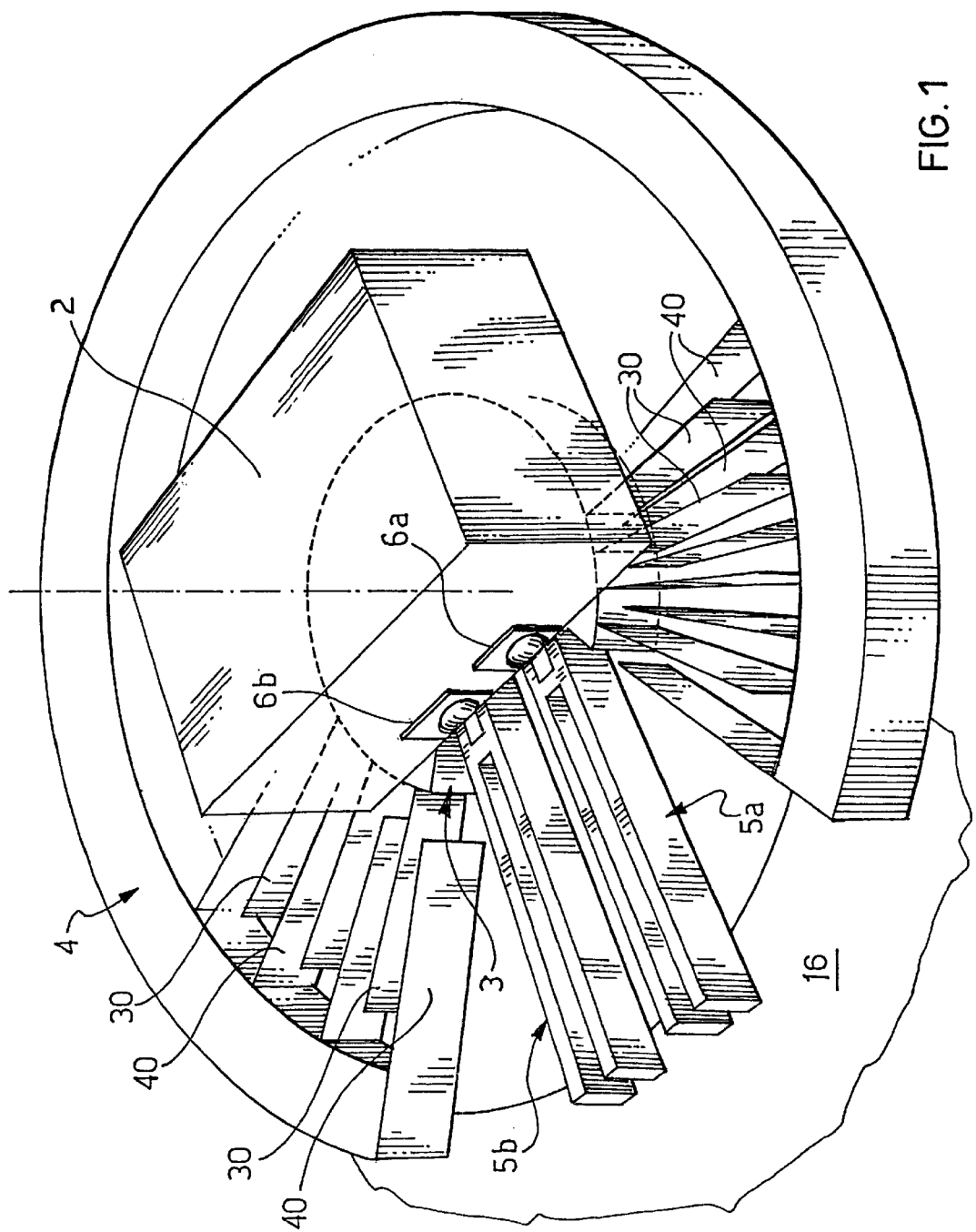
FIG. 1 is a cross-sectional perspective view of a hard-disk reading/writing transducer and a respective micro-actuator according to a first embodiment of the present invention.

Referring now to FIG. 1, a cross-sectional perspective view of a micro-actuator 1 of the type used in a hard-disk reading/writing unit for the fine positioning of a reading/writing transducer (head or slider) 2 is shown.

The micro-actuator 1 in the embodiment shown is an electrostatic micro-actuator comprising an inner rotor 3 and an outer stator 4, both made of polysilicon. Movable electrodes 30 projecting radially from the periphery of the rotor 3 are interdigitated with fixed electrodes 40 which project radially from the stator 4 towards the rotor 3. A micro-actuator of this type is described, for example, in the European Patent Application No. 913921, which is incorporated herein by reference in its entirety, and is assigned to the assignee of the present invention.

The slider 2 is fixed to the rotor 3, and is typically glued to a support plate, which in turn is anchored to the rotor 3. The support plate is not shown for greater clarity of the drawings. Two suspended and flexible electrical connection elements 5a, 5b are visible in FIG. 1 and extend from the outer periphery of the micro-actuator 1 in a circular-sector-shaped region, in which the stator and the rotor are interrupted, to the respective electrical terminals 6a, 6b of the slider 2.

Figure 2:
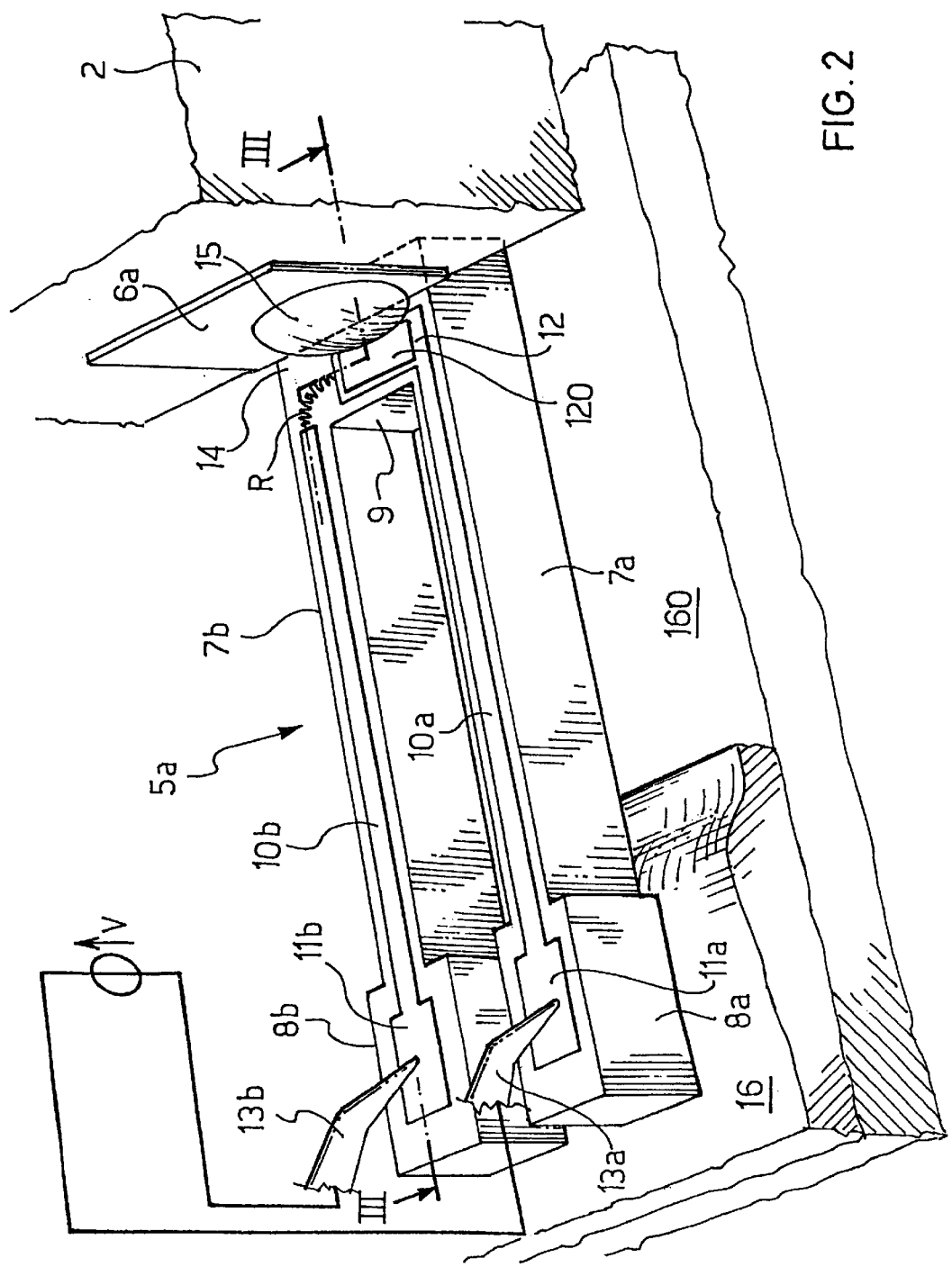
FIG. 2 is a perspective view showing on an enlarged scale an element for electrical connection to the reading/writing transducer shown in FIG. 1.

Referring now to the enlarged view of FIG. 2, each electrical connection element comprises a pair of substantially parallel bars 7a, 7b anchored in a cantilevered manner to a layer of insulating material 16 and suspended above an underlying semiconductor substrate 160. The bars 7a, 7b are made, for example, from the same polysilicon layer from which the rotor and the stator are made.

Each bar 7a, 7b has an enlarged head 8a, 8b, anchored to the layer 16, and the end of the bar remote from the head is joined to the other bar of the pair by a crosspiece 9. A pad 11a, 11b of conductive material, such as aluminium or copper, is formed on each bar 7a, 7b on the head 8a, 8b. A respective track 10a, 10b is also made of conductive material, such as aluminium or copper, that extends from the pad.

The track 10b terminates substantially in the region of the crosspiece 9, whereas the track 10a extends to merge with a pad 12 of conductive material, such as aluminium or copper. The soldering area 120 is gold-plated and is formed on the crosspiece 9 substantially beneath the electrical terminal 6a, 6b of the slider 2.

The pads 11a, 11b and 12, the tracks 10a and 10b, and the portion 14 of the crosspiece 9 between the end of the pad 12 and the end of the track 10b form a conductive path for the overall resistance of which is concentrated substantially in the polysilicon portion 14. This resistance has greater resistivity than aluminum or copper, as shown schematically by the resistor R.

Figure 3:
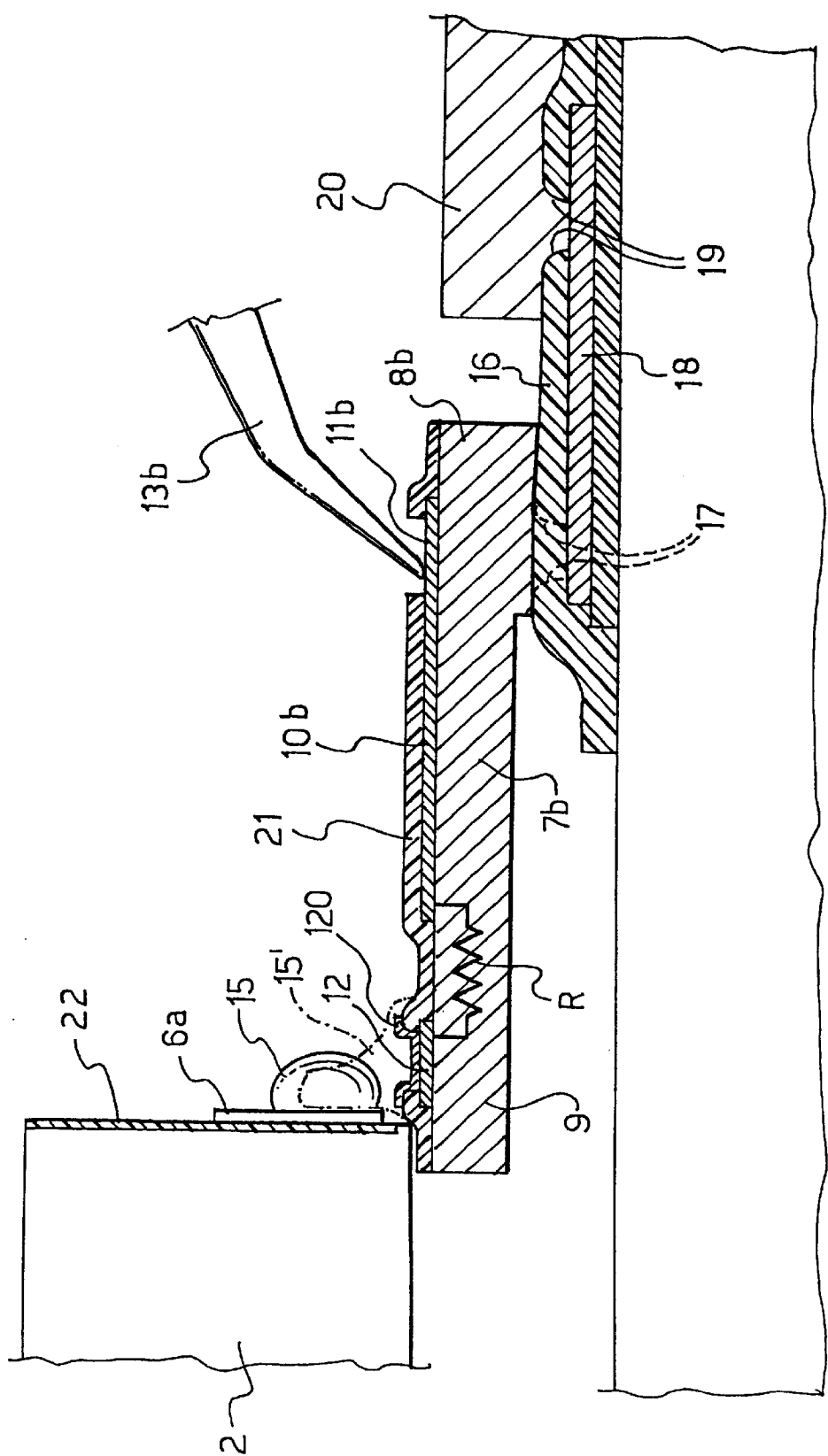
FIG. 3 is a cross-sectional view taken along the line III—III of FIG. 2.

As shown in greater detail in FIG. 3, the bar 7b is anchored in a cantilevered manner to the insulating layer 16 which, for example, is made of silicon oxide. The bar 7a contacts through an opening 17 in the oxide layer 16 an underlying polysilicon layer 18 which extends out of the micro-actuator. This layer is contacted through another opening 19 in the oxide layer 16 by another polysilicon bar 20.

Polysilicon bar 20 extends as far as the periphery of the chip containing the micro-actuator. This is for the soldering of electrical wires which will be connected to the electrical terminals 6a, 6b of the slider. The tracks 10a, 10b are covered by a layer of passivating material 21 which has openings on the pad 12 to permit soldering to the electrical terminals 6a, 6b of the slider, and on the pads 11a, 11b to permit contact by electrical-energy supply probes 13a, 13b.

The electrical terminals 6a, 6b of the slider are formed on a dielectric layer 22 which thermally insulates the body of the slider. To solder the terminals of the slider, the two probes 13a, 13b are placed on the pads 11a, 11b and an electric pulse is applied to the probes to close the electrical circuit. The electric pulse may include a voltage V as shown schematically in FIG. 2.

The current which flows in the circuit brings about localized heating by the Joule effect in the region of the resistor R, that is, the portion of the circuit having greater resistance. Resulting heat melts a spot 15 of soldering material, such as a lead/tin alloy previously applied to the electrical terminal 6a, 6b of the slider, for example. As the spot 15 melts, it drops onto the pad 12 as indicated schematically 15' in chain line. When the voltage supply to the electric circuit is interrupted, the molten soldering material sets. This causes soldering of the slider terminal to the pad 12, and hence the electrical connection to the pad 11a.

In other words, the circuit portion with greater resistance R acts as an integrated local Joule-effect micro-heater. The heat generated by the micro-heater by the Joule effect is utilized to melt the solder 15. The micro-heater is activated by the application of a suitable voltage upstream or downstream thereof by supplying electrical energy thereto.

Clearly, variations and/or additions may be applied to the embodiment described and illustrated above. For example, instead of providing pairs of polysilicon bars, the electric soldering circuit may be formed on a single bar of sufficient width. The two pads 11a and 11b for the probes 13a and 13b, the two tracks 10a and 10b, and the pad 12 may be on the single bar of sufficient width.

Moreover, the bars 7a and 7b and the crosspiece 14 may be made of materials other than polysilicon, possibly even of insulating material. The micro-heaters may be formed on the bars by the deposition of a refractory and sufficiently resistive material instead of being formed by respective portions of the bars.

Figure 4:
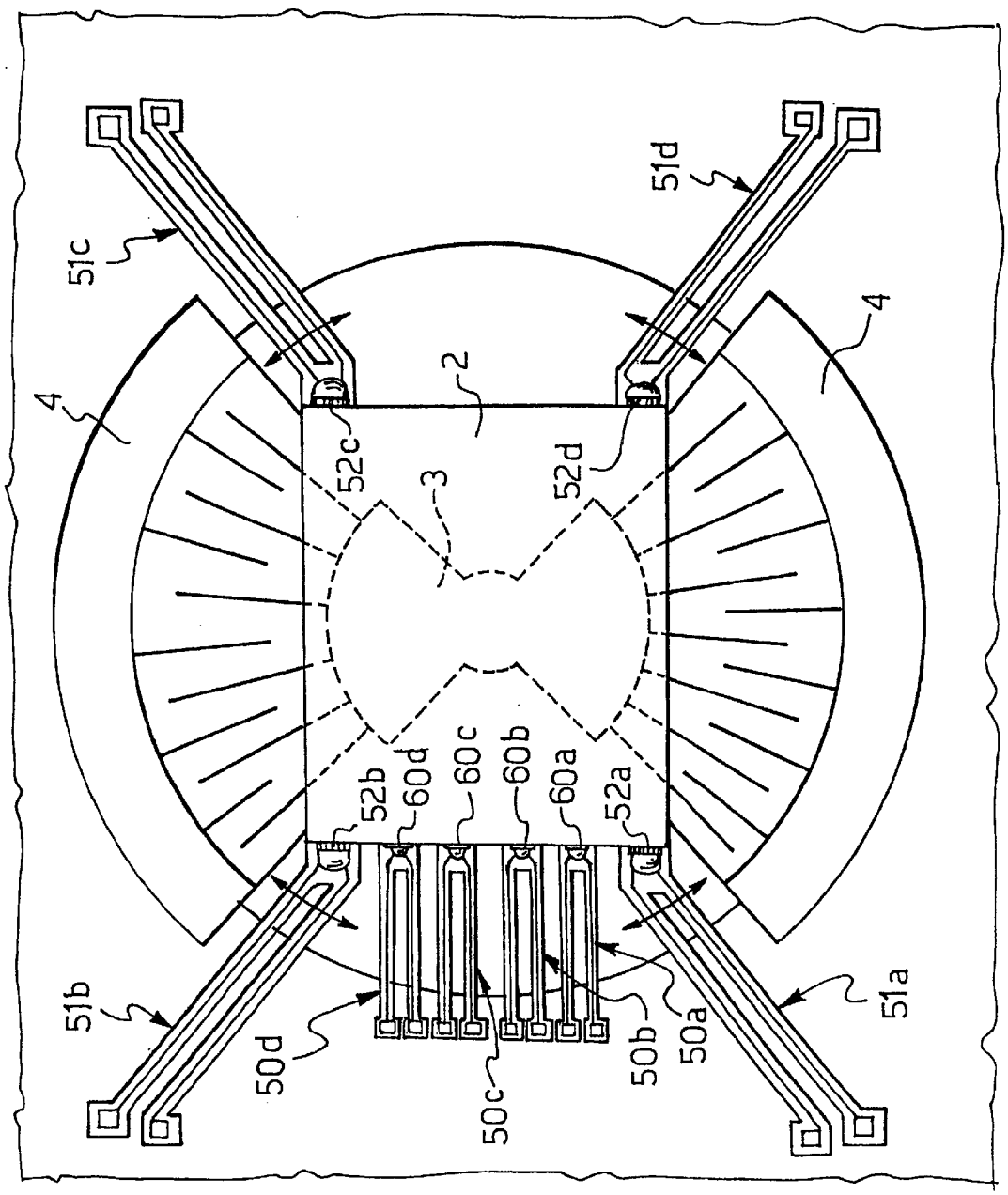
FIG. 4 is a top plan view of the reading/writing transducer and the respective micro-actuator showing electrical and mechanical connection elements according to a variation of the first embodiment of the present invention.

The plan view of FIG. 4 shows a variation of the embodiment described above in which the method according to the invention is used not only for soldering electrical terminals 60a–60d of the slider 2 to respective electrical connection elements 50a–50d similar to the elements 5a and 5b of FIG. 1, but also for soldering points 52a–52d for the mechanical anchoring of the slider 2 to respective flexible elements (springs) 51a–51d. This anchoring is for the mechanical connection of the slider to the chip containing the micro-actuator.

Both the electrical connection springs 50a–50d and the mechanical connection springs 51a–51d are formed as shown in FIGS. 2 and 3, and as described with reference thereto. The points 52a–52d for the mechanical anchoring of the slider are soldered to the respective mechanical connection springs 51a–51d in the manner described above.

By virtue of the present invention, the soldering operation for the electrical and/or mechanical interconnection of the slider to the micro-actuator poses no problems, and there is no risk of damaging the delicate structure of the micro-actuator. The method according to the present invention may also advantageously be used for unsoldering the slider from the micro-actuator. This is done, for example, if faults in the micro-actuator, in the circuitry integrated in the micro-actuator chip, or in the slider are detected during testing.

It is possible, by proceeding as described above for the soldering, to unsolder the slider and to replace the faulty component with a functioning one. The need to discard the entire microelectronic system because of a fault which affects a single component is thus avoided.

Figure 5:
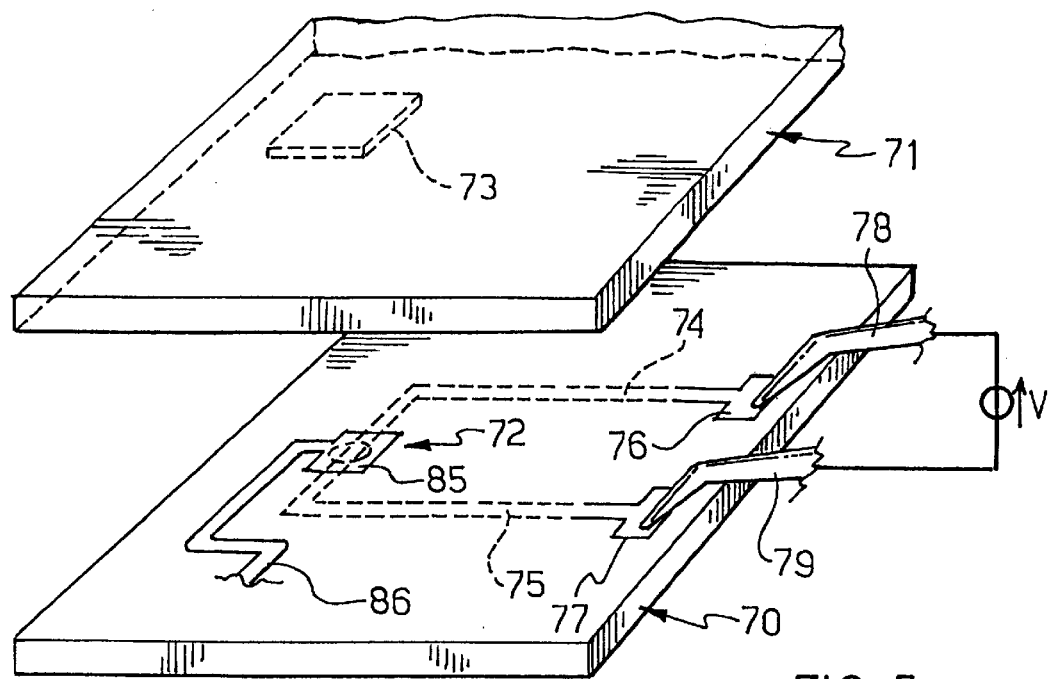
FIG. 5 is a perspective view of two chips of a multichip system before their interconnection according to a second embodiment of the present invention.
Figure 6:
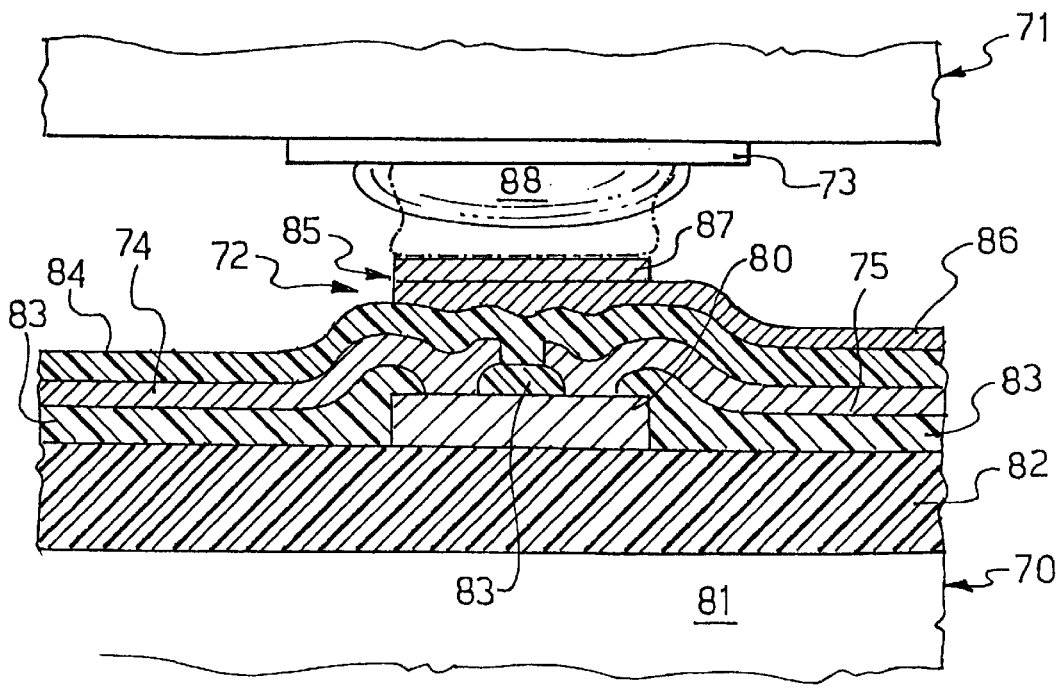
FIG. 6 is a detailed cross-sectional view of the two chips shown in FIG. 5.

FIGS. 5 and 6 show schematically a second possible embodiment of the invention for the electrical and/or mechanical interconnection of two chips 70 and 71, each incorporating respective integrated circuits to form a multichip system. Local Joule-effect micro-heaters 72 is incorporated in the chip 70 in positions corresponding to those of soldering pads 73 of the chip 71. The micro-heater 72 comprises resistive elements connected in an electrical circuit comprising a pair of tracks 74 and 75 of conductive material. The conductive material may be aluminum or copper, for example. The pair of tracks 74 and 75 terminate in respective pads 76, 77 on which probes 78, 79 can be placed.

As shown in FIG. 6, the micro-heater 72 comprises a resistive element 80 of refractory material of sufficient resistivity, such as polysilicon, separated from a semiconductor substrate 81 of the chip 70 by a dielectric layer 82 of low thermal conductivity, such as silicon oxide. The two tracks 74, 75 contact the resistive element 80 at two respective points through respective openings in an insulating layer 83. A dielectric layer 84 covers the resistive element 80 and the tracks 74 and 75. A soldering pad 85 formed above the dielectric layer 84 comprises an enlarged head of a track 86, such as aluminium or copper, for electrical interconnection between the two chips 70 and 71. A layer of gold 87 is preferably formed on the pad 85.

Spots 88 of solder, typically a lead/tin alloy, are applied to the pads 73 of the chip 71 or, may equally be applied to the corresponding pads 85 of the chip 70. The two chips are then brought together to bring the pads 73 adjacent the respective pads 85. The probes 78 and 79 are placed on the pads 76 and 77 and a voltage V is applied thereto. The current which conducts in the electrical circuit formed by the tracks 74 and 75, and by the resistive element 80 brings about heating of the resistive element 80 by the Joule effect. The heat thus produced causes the spot of solder 88 to melt, soldering the pads 73 and 85 together, thus interconnecting the two chips 70, 71 electrically and mechanically.

In this embodiment also, the soldering is achieved easily and does not pose problems of damage to the structures incorporated in the two chips. Moreover, if at a testing stage subsequent to the interconnection it is found that one of the two chips is defective, the two chips can be unsoldered and the faulty chip can be replaced by a new, functioning chip. The unsoldering is performed in exactly the same way as the soldering.

Clearly, variations of the embodiment described and illustrated may also be provided in this second embodiment of the invention. For example, the pad 85 could be connected in the conductive path 74–77 for the supply of electrical energy to the resistive element 80.

That which is claimed is:

1. A method for connecting first and second micro electrical/mechanical system (MEMS) components, the method comprising:
    forming at least one Joule-effect micro-heater on at least one of the first and second MEMS components at a connection point; and
    supplying electrical energy to the at least one Joule-effect micro-heater to utilize heat produced therefrom for melting a solder onto the connection point for connecting the first and second MEMS components at the connection point.

2. A method according to claim 1, wherein forming the at least one Joule-effect micro-heater comprises forming a resistive element in a conductive path having a resistance substantially concentrated in the resistive element.

3. A method according to claim 2, wherein supplying electrical energy to the at least one Joule-effect micro-heater comprises applying a voltage at a first point of the conductive path upstream of the resistive element and at a second point of the conductive path downstream of the resistive element for defining a closed circuit with the resistive element.

4. A method according to claim 3, further comprising forming respective first contact pads at the first point and at the second point of the conductive path; and wherein the voltage is applied to the respective first contact pads via a micro-probe.

5. A method according to claim 1, further comprising forming a second contact pad at the connection point for receiving the melted solder.

6. A method according to claim 5, wherein forming the at least one Joule-effect micro-heater comprises forming a conductive path; and wherein the second contact pad is connected to the conductive path for forming an electrical connection between the first and second MEMS components.

7. A method according to claim 1, further comprising:
    testing the first and second MEMS components after being connected; and
    supplying the electrical energy to the at least one Joule-effect micro-heater to utilize heat produced therefrom for disconnecting the first and second MEMS components if one of the first and second components is defective.

8. A method for connecting first and second micro electrical/mechanical system (MEMS) components, the method comprising:
    forming at least one micro-heater on at least one of the first and second MEMS components at a connection point, the micro-heater comprising a resistive element in a conductive path having a resistance substantially concentrated in the resistive element; and
    applying a voltage to the at least one micro-heater to utilize heat produced therefrom for melting a solder onto the connection point for connecting the first and second MEMS components.

9. A method according to claim 8, wherein applying the voltage comprises applying the voltage at a first point of the conductive path upstream of the resistive element and at a second point of the conductive path downstream of the resistive element for defining a closed circuit with the resistive element.

10. A method according to claim 9, further comprising forming respective first contact pads at the first point and at the second point of the conductive path; and wherein the voltage is applied to the respective first contact pads via a micro-probe.

11. A method according to claim 8, further comprising forming a second contact pad at the connection point for receiving the melted solder.

12. A method according to claim 11, wherein forming the at least one micro-heater comprises forming a conductive path in one of the first and second MEMS components; and wherein the second contact pad is connected to the conductive path for forming an electrical connection between the first and second MEMS components.

13. A method according to claim 8, further comprising:
    testing the first and second MEMS components after being connected; and
    applying the voltage to the at least one micro-heater to utilize heat produced therefrom for disconnecting the first and second MEMS components if one of the first and second MEMS components is defective.

14. A method for connecting a transducer to a rotor of a micro-actuator, the method comprising:
    forming at least one micro-heater on the rotor at a connection point, the micro-heater comprising a resistive element in a conductive path in the rotor, the conductive path having a resistance substantially concentrated in the resistive element; and
    applying a voltage to the at least one micro-heater to utilize heat produced therefrom for melting a solder onto the connection point for connecting the transducer to the rotor.

15. A method according to claim 14, wherein the conductive path comprises at least one flexible connection element fixed in a cantilevered manner to a static portion of the rotor and extending towards a terminal of the transducer.

16. A method according to claim 15, wherein the at least one flexible connection element comprises polycrystalline silicon, and the conductive path comprises a material more conductive than the polycrystalline silicon.

17. A method according to claim 15, wherein the at least one flexible connection element includes the resistive element between a first portion and a second portion of the conductive path.

18. A method according to claim 15, wherein the conductive path comprises metal on the at least one flexible connection element.

19. A method according to claim 15, wherein the at least one flexible connection element comprises a pair of substantially parallel bars anchored at respective enlarged first ends to the static portion of the rotor and being joined together by a crosspiece at an opposite end thereof adjacent the terminal of the transducer.

20. A method according to claim 19, further comprising:
forming first contact pads on the enlarged first ends of the respective bars; and
forming a second contact pad on the crosspiece, with the resistive element being formed by a portion of the crosspiece.

21. A method according to claim 20, wherein the at least one flexible connection element, and the first and second contact pads provide an electrical connection between the terminal of the transducer and the rotor.

22. A method according to claim 8, wherein the transducer comprises a hard-disk reading/writing transducer, and wherein the micro-actuator is on a chip of semiconductor material.

23. A micro electrical/mechanical system (MEMS) comprising:
a first MEMS component comprising at least one micro-heater at a respective connection point, said micro-heater comprising a conductive path with a resistive element therein, the conductive path having a resistance substantially concentrated in said resistive element; and
a second MEMS component having solder at the respective connection point so that when a voltage is applied to said at least one micro-heater heat produced therefrom melts the solder onto the connection point for connecting said first and second MEMS components.

24. A MEMS according to claim 23, wherein said conductive path comprises a first point upstream of said resistive element and at a second point of the conductive path downstream of said resistive element for defining a closed circuit with said resistive element.

25. A MEMS according to claim 24, wherein said conductive path further comprises respective first contact pads at the first point and at the second point of said conductive path; and wherein the electrical energy is applied to the respective first contact pads via a micro-probe.

26. A MEMS according to claim 23, wherein said conductive path further comprises a second contact pad at the connection point for receiving the melted solder.

* * * * *